United States Patent
Choi et al.

(10) Patent No.: US 7,566,608 B2
(45) Date of Patent: Jul. 28, 2009

(54) METHODS OF FORMING THIN LAYERS INCLUDING ZIRCONIUM HAFNIUM OXIDE AND METHODS OF FORMING GATE STRUCTURES, CAPACITORS, AND FLASH MEMORY DEVICES USING THE SAME

(75) Inventors: Dae-Sik Choi, Seoul (KR); Kyoung-Ryul Yoon, Gyeonggi-do (KR); Han-Mei Choi, Seoul (KR); Ki-Yeon Park, Gyeonggi-do (KR); Seung-Hwan Lee, Seoul (KR); Sung-Tae Kim, Seoul (KR); Young-Sun Kim, Gyeonggi-do (KR); Cha-Young Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 362 days.

(21) Appl. No.: 11/285,555

(22) Filed: Nov. 22, 2005

(65) Prior Publication Data

US 2006/0141695 A1    Jun. 29, 2006

(30) Foreign Application Priority Data

Nov. 23, 2004    (KR) .................. 10-2004-0096065

(51) Int. Cl.
*H01L 21/8238* (2006.01)
(52) U.S. Cl. .................. 438/216; 438/287; 438/591; 257/E21.625
(58) Field of Classification Search .................. 438/3, 438/216, 240, 287, 591; 257/E21.625, E21.639
See application file for complete search history.

(56) References Cited

U.S. PATENT DOCUMENTS

| 6,348,386 B1 | 2/2002 | Gilmer ............... 438/287 |
| 2002/0190294 A1 | 12/2002 | Iizuka et al. ............... 257/296 |
| 2003/0048666 A1 | 3/2003 | Eldridge et al. ............... 365/185.28 |
| 2003/0201485 A1 | 10/2003 | Hiratani et al. ............... 257/310 |
| 2004/0033698 A1 | 2/2004 | Lee et al. ............... 438/758 |
| 2004/0040501 A1* | 3/2004 | Vaartstra ............... 118/715 |
| 2004/0072401 A1* | 4/2004 | Iizuka et al. ............... 438/240 |
| 2004/0092073 A1 | 5/2004 | Cabral, Jr. et al. ............... 438/287 |

FOREIGN PATENT DOCUMENTS

| KR | 1020020085794 | 11/2002 |
| KR | 1020020094933 | 12/2002 |
| KR | 10-2004-0084700 | 10/2004 |
| KR | 10-2004-0085925 | 10/2004 |

OTHER PUBLICATIONS

Notice of Submit a Response for Korean Patent Application No. 10-2004-0096065 mailed on Apr. 28, 2006.

* cited by examiner

*Primary Examiner*—Thanhha Pham
(74) *Attorney, Agent, or Firm*—Myers Bigel Sibley & Sajovec, PA

(57) ABSTRACT

Methods of forming a zirconium hafnium oxide thin layer on a semiconductor substrate by supplying tetrakis(ethylmethylamino)zirconium ($[Zr\{N(C_2H_5)(CH_3)\}_4]$, TEMAZ) and tetrakis(ethylmethylamino)hafnium ($[Hf\{N(C_2H_5)(CH_3)\}_4]$, TEMAH) to a substrate are provided. The TEMAZ and the TEMAH may be reacted with an oxidizing agent. The thin layer including zirconium hafnium oxide may be used for a gate insulation layer in a gate structure, a dielectric layer in a capacitor, or a dielectric layer in a flash memory device.

31 Claims, 14 Drawing Sheets

METHODS OF FORMING THIN LAYERS INCLUDING ZIRCONIUM HAFNIUM OXIDE AND METHODS OF FORMING GATE STRUCTURES, CAPACITORS, AND FLASH MEMORY DEVICES USING THE SAME

CROSS REFERENCE TO RELATED APPLICATION

This application claims priority to Korean Patent Application No. 2004-96065 filed on Nov. 23, 2004, the content of which is herein incorporated by reference in its entirety.

FIELD OF THE INVENTION

The present invention relates to methods of forming thin layers and methods of forming gate structures, capacitors, and flash memory devices using the same.

BACKGROUND OF THE INVENTION

Thin layers used in semiconductor devices, such as gate insulation layers, dielectric layers in a capacitors, and dielectric layers in flash memory devices, may include high dielectric constant materials, or "high-k materials." These high-k thin layers can sufficiently minimize current leakage between electrodes and channels in a gate structure, or between upper and lower electrodes in a capacitor with a relatively small equivalent oxide thickness (EOT). Further, thin layers including high-k materials can also improve the coupling ratio in flash memory devices. Examples of high-k materials include tantalum oxide ($Ta_2O_5$), yttrium oxide ($Y_2O_3$), hafnium oxide ($HfO_2$), zirconium oxide ($ZrO_2$), niobium oxide ($Nb_2O_5$), barium titanium oxide ($BaTiO_3$), and strontium titanium oxide ($SrTiO_3$).

Hafnium oxide is an example of a high-k material that has been used in semiconductor thin layers. For example, the use of hafnium oxide in semiconductor thin layers is discussed in U.S. Pat. No. 6,348,386. However, the dielectric constant of hafnium oxide is only about 20, so that the use of hafnium oxide may not be recommended for use in thin layers in the most recent semiconductor devices, wherein the layer material may have a dielectric constant over about 20.

As a result, zirconium oxide, which has a dielectric constant of about 55 and an EOT equivalent to hafnium oxide, may be used as a substitute for hafnium oxide in semiconductor thin layers. For example, methods of forming zirconium oxide layers are discussed in U.S. Patent Application Publication Nos. 2004-033698 and 2002-190294. However, zirconium oxide layers may have poor surface morphology, and thus, the electric field can become concentrated at certain areas of the surface of the zirconium oxide layer. These concentrations of electric field can cause current leakage from the surface of the zirconium oxide layer.

For these reasons, zirconium hafnium oxide may be used for thin layers in the latest semiconductor devices. The combination of zirconium and hafnium oxides may provide for a higher dielectric constant than a pure hafnium oxide layer, and may also provide for better surface morphology than a pure zirconium oxide layer.

Examples of semiconductor thin layers including zirconium hafnium oxide are discussed in Korean Patent Laid-Open Publication Nos. 2002-094933 and 2002-85794, which are assigned to Samsung Electronics Co., Ltd., and also in U.S. Patent Application Publication Nos. 2004-92073 and 2003-048666. For example, U.S. Patent Application Publication No. 2004-92073 discusses a method of forming a zirconium hafnium oxide layer by a chemical vapor deposition (CVD) process that uses a zirconium alkoxide as a zirconium precursor and a hafnium alkoxide as a hafnium precursor. As another example, Korean Patent Laid-Open Publication No. 2002-94933 discusses a method of forming a zirconium hafnium oxide layer by atomic layer deposition (ALD) using zirconium chloride ($ZrCl_4$) and hafnium chloride ($HfCl_4$).

SUMMARY OF THE INVENTION

Some embodiments according to the invention provide methods of forming a zirconium hafnium oxide thin layer for a semiconductor device with a mixture of zirconium and hafnium precursors.

In some embodiments, a thin layer including zirconium hafnium oxide is formed on a semiconductor substrate by supplying tetrakis(ethylmethylamino)zirconium (TEMAZ) and tetrakis(ethylmethylamino)hafnium (TEMAH) to the substrate.

In some embodiments according to the invention, a zirconium hafnium oxide thin layer is formed on a semiconductor substrate by supplying reactants, which include TEMAZ and TEMAH, and an oxidizing agent, to the substrate.

In other embodiments according to the invention, a gate structure with an insulation layer including zirconium hafnium oxide layer is formed by supplying TEMAZ and TEMAH to a substrate.

In some embodiments according to the invention, a method of forming a gate structure for a semiconductor device includes forming a gate insulation layer including zirconium hafnium oxide by supplying to a substrate a mixture of TEMAZ and TEMAH and an oxidizing agent; forming a gate conductive layer; and forming a gate insulation pattern on the substrate by sequentially patterning the gate conductive layer and the gate insulation layer.

In other embodiments according to the invention, a capacitor with a dielectric layer including zirconium hafnium oxide is formed by supplying TEMAZ and TEMAH to a substrate.

In some embodiments according to the invention, a method of forming a capacitor for a semiconductor device includes forming a lower electrode on a substrate; forming a dielectric layer including zirconium hafnium oxide on the lower electrode by supplying a mixture of TEMAZ and TEMAH and an oxidizing agent to the lower electrode; and forming an upper electrode on the dielectric layer.

In some embodiments according to the invention, a flash memory device with a dielectric layer including zirconium hafnium oxide is formed by supplying TEMAZ and TEMAH to a substrate.

In some embodiments of the invention, a method of manufacturing a flash memory device includes forming a tunnel oxide layer on a substrate; forming a floating gate on the tunnel oxide layer; forming a dielectric layer including zirconium hafnium oxide on the floating gate by supplying to the substrate a mixture of TEMAZ and TEMAH and an oxidizing agent; and forming a control gate on the dielectric layer.

BRIEF DESCRIPTION OF THE DRAWINGS

In FIG. 2, the line pattern (----) indicates the P-T curve of TEMAH and the line pattern (---) indicates the P-T curve of TEMAZ. Further, the line pattern (———) indicates the P-T curve of Hf(O$^t$Bu)$_4$ and the line pattern (- - - -) indicates the P-T curve of Zr(O$^t$Bu)$_4$.

DETAILED DESCRIPTION OF EMBODIMENTS ACCORDING TO THE INVENTION

Figure 1A:
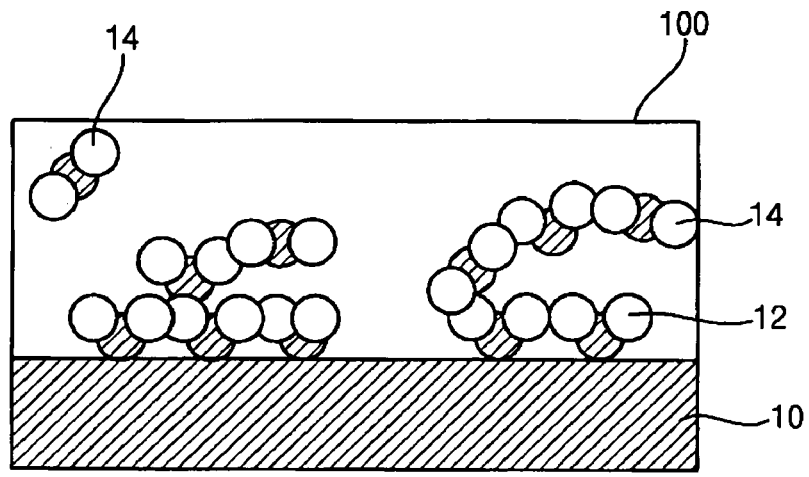
FIGS. 1A to 1E are cross-sectional views illustrating methods of forming a thin layer for a semiconductor device according to some embodiments of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to," or "coupled to" another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper," and the like, may be used herein for ease of description to describe one element or feature's relationship to (an)other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the acronym TEMAZ is meant to refer to tetrakis(ethylmethylamino)zirconium, which refers to a compound having the chemical formula [Zr{N(C$_2$H$_5$)(CH$_3$)}$_4$]. The acronym TEMAH is meant to refer to tetrakis(ethylmethylamino)hafnium, which refers to a compound having the chemical formula [Hf{N(C$_2$H$_5$)(CH$_3$)}$_4$]. As used herein, the name zirconium tert-butoxide refers to a compound having the chemical formula Zr[OC(CH$_3$)$_3$]$_4$, which may also be referred to as Zr(O$^t$Bu)$_4$ or zirconium butyl oxide. The name hafnium tert-butoxide refers to a compound having the chemical formula Hf[OC(CH$_3$)$_3$]$_4$, which may also be referred to as Hf(O$^t$Bu)$_4$ or hafnium butyl oxide. The acronyms, names, and chemical formulas of each particular compound are used interchangeably herein.

Referring to FIG. 1A, a substrate 10 is loaded into a chamber 100 in which a process for forming a thin layer on the substrate 10 is to be performed. When the temperature in the chamber 100 is less than about 200° C., the reactivity of the reactants may be low, so a thin layer may not form on the substrate 10. When the temperature in the chamber 100 is greater than about 500° C., the thin layer may not crystallize onto the substrate 10. Accordingly, in some embodiments, the temperature in the chamber 100 ranges from about 200° C. to about 500° C. Further, when the pressure in the chamber 100 is less than about 0.1 torr, the reactivity of the reactants may be low, so a thin layer may not form on the substrate 10. When the pressure in the chamber 100 is greater than about 3.0 torr, the process for forming the thin layer may be difficult to control. Accordingly, in some embodiments, the pressure in the chamber 100 ranges from about 0.1 torr to about 3.0 torr.

Thus, according to some embodiments, once the proper conditions are established, the reactants, which include a zirconium precursor and a hafnium precursor, are supplied into the chamber 100 while maintaining the above-specified pressure and temperature ranges. Examples of zirconium precursors include TEMAZ and zirconium tert-butoxide. The zirconium precursors may be used alone or in combination thereof. Examples of hafnium precursors are TEMAH and hafnium tert-butoxide. The hafnium precursors may be used alone or in combination thereof. Thus, when the term "mixture" is used with respect to any particular precursors, it is meant a combination of the two precursors that may optionally include other precursors, reagents, and the like.

Figure 2:
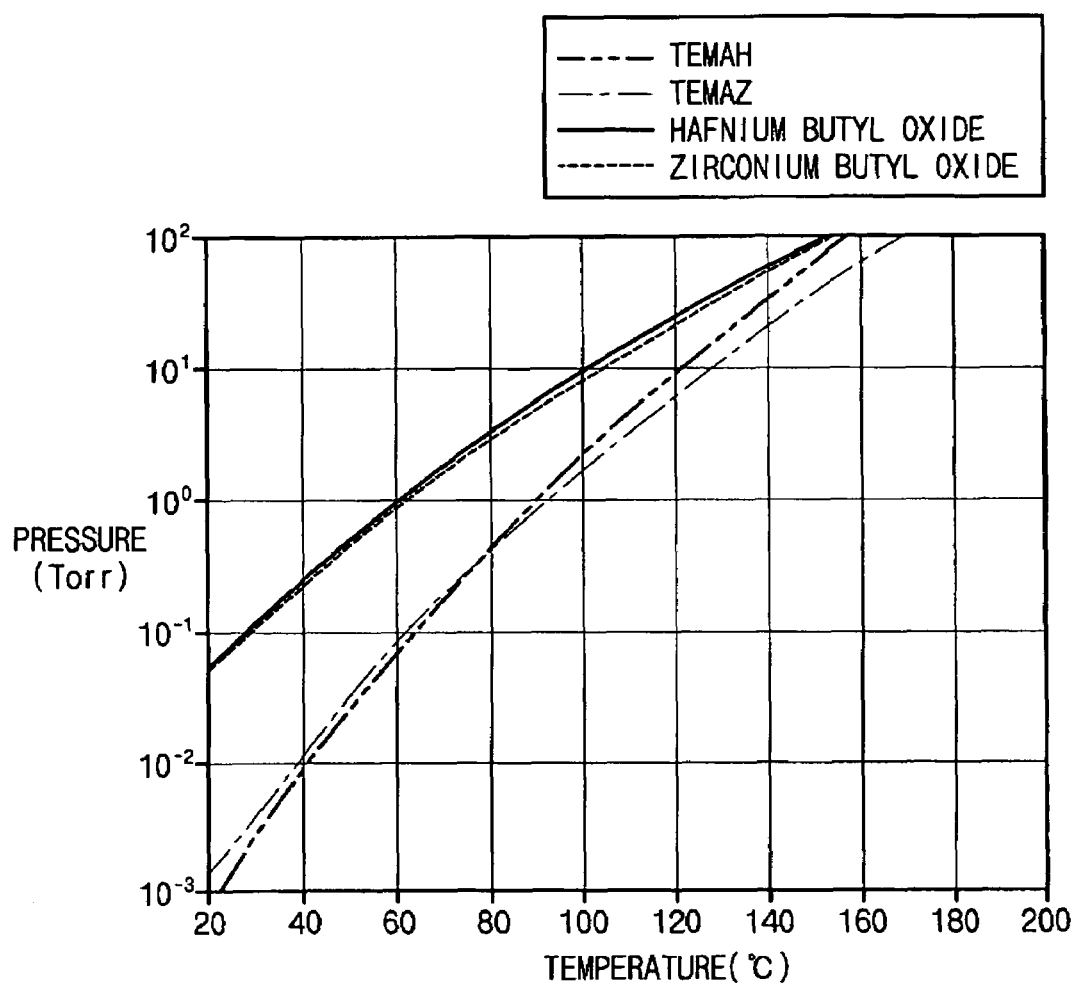
FIG. 2 is a graph illustrating the relationship between the temperature and pressure of TEMAZ, TEMAH, $Zr(O^tBu)_4$, and $Hf(O^tBu)_4$, respectively (hereinafter referred to as "the P-T curve").

Referring to FIG. 2, the P-T curve of TEMAZ is similar to the P-T curve of TEMAH, and the P-T curve of $Zr(O^tBu)_4$ is similar to the P-T curve of $Hf(O^tBu)_4$. As a result, according to some embodiments of the invention, the reactants used to make the thin layer include either a mixture of TEMAZ and TEMAH or a mixture of $Zr(O^tBu)_4$ and $Hf(O^tBu)_4$.

Figure 3:
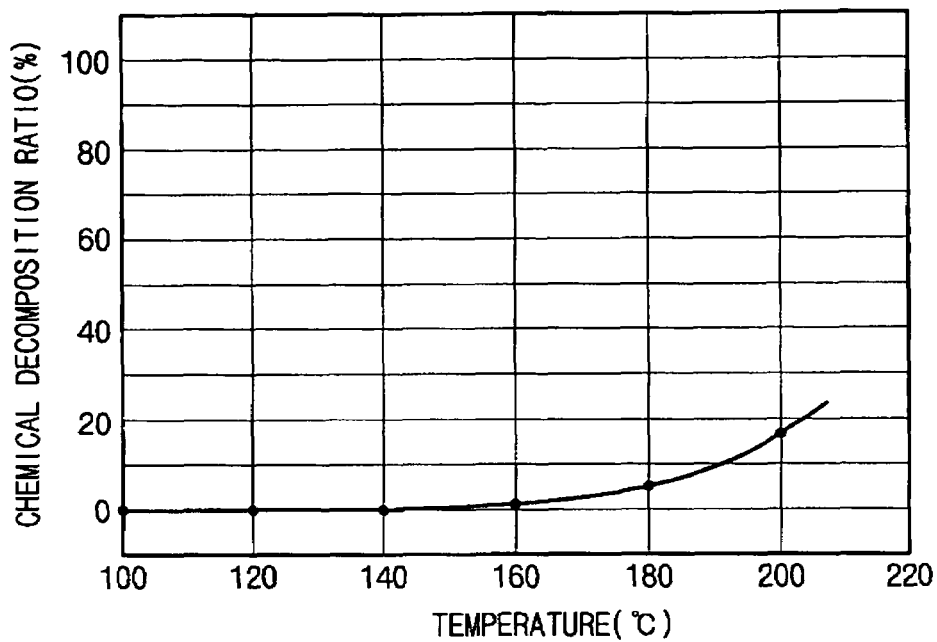
FIG. 3 is a graph illustrating the effect of temperature on the chemical decomposition ratio of TEMAZ.
Figure 4:
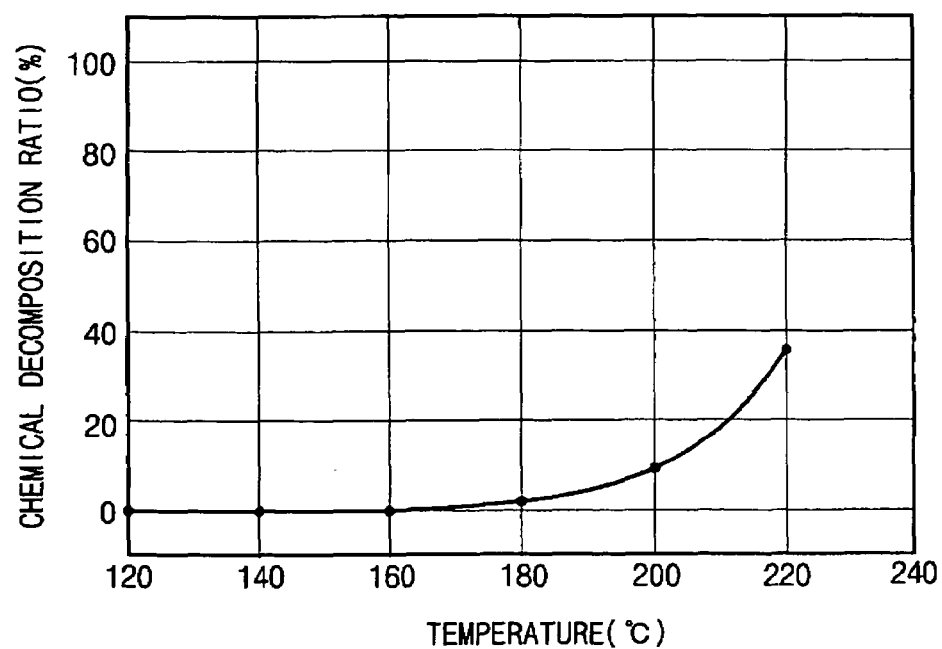
FIG. 4 is a graph illustrating the effect of temperature on the chemical decomposition ratio of TEMAH.

Referring to FIGS. 3 and 4, the graphs were obtained by the following procedure: TEMAZ and TEMAH were heated for approximately one hour, and the chemical decomposition ratios of TEMAZ and TEMAH were separately measured by thermogravimetric/differential thermal analysis (TG-DTA). Accordingly, the graphs in FIGS. 3 and 4 illustrate the thermal stability of TEMAZ and TEMAH, respectively. Thus, TEMAZ chemically decomposes at a temperature of about 160° C., and TEMAH chemically decomposes at a temperature of about 180° C. Accordingly, when TEMAZ and TEMAH are used in making a thin layer, the reactants may, in some embodiments, be at a temperature in the range of about 60° C. to about 160° C.

Figure 5:
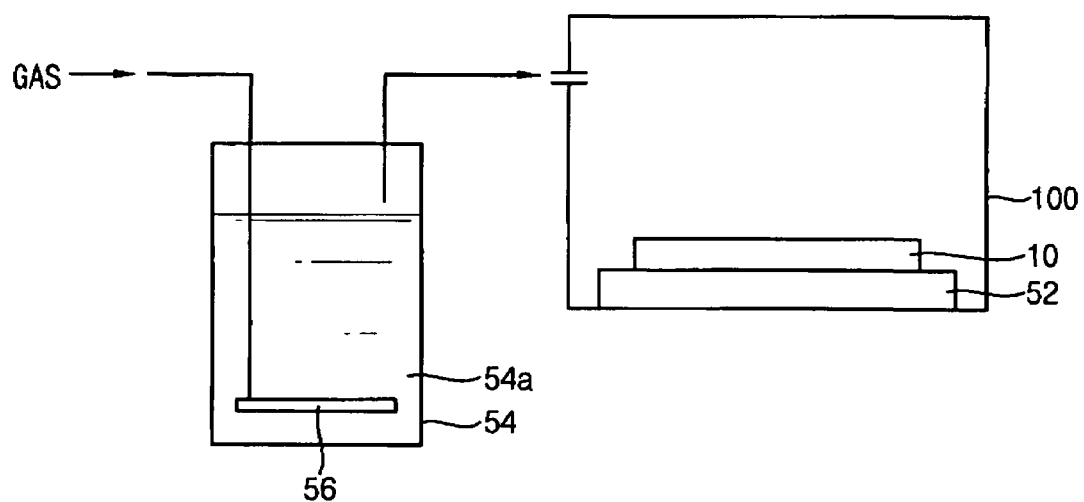
FIG. 5 is a schematic illustrating the supply of the reactants into the chamber, according to some embodiments of the present invention.

Referring to FIG. 5, a canister 54 containing reactants 54a is connected to a chamber 100. In some embodiments, the reactants 54a are in the liquid state. When the reactants include a mixture of TEMAZ and TEMAH, the liquid reactant material is at a temperature in the range of about 60° C. to about 160° C. In some embodiments, a bubbler 56 is installed in the canister 54, so that the liquid reactant mixture 54a is bubbled with an external gas supplied from the outside.

When the bubbler 54 is used, the reactants 54a stored in the canister 54 in the liquid state may be converted to the gaseous state by the bubbler 56, so that the reactants 54a are supplied onto the substrate 10 in the chamber 100 from the gaseous state. In FIG. 5, the reference numeral 52 denotes a plate, such as a chuck, on which the substrate 10 may be positioned.

Referring to FIG. 1A, the TEMAZ/TEMAH reactant mixture is supplied onto the substrate 10 in the chamber 100 for a time period in the range of about 0.5 seconds to about 7 seconds, according to some embodiments of the invention. Then, a first portion 12 of the reactant mixture is chemisorbed onto the substrate 10, and the remaining portion 14 of the reactant mixture is physisorbed onto the substrate 10 or drifted in the chamber 100.

Figure 1B:
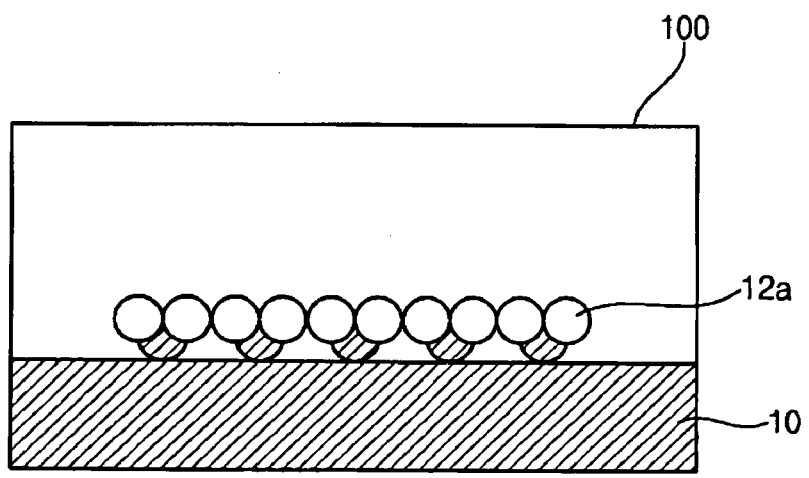

Referring to FIG. 1B, a purge gas is supplied into chamber 100 for a time period in the range of about 0.5 seconds to about 20 seconds, according to some embodiments of the invention. An example of a purge gas includes an unreactive gas such as an inert gas. In some embodiments, argon or nitrogen gas is used as the purge gas. Accordingly, the remaining portion 14 of the reactants may be purged from the chamber 100, so that only the first portion 12 of the reactants remains on the substrate 10 as a single layer of precursor molecules 12a.

In some embodiments, a vacuum is applied to the chamber 100, and in some embodiments, for a period of time in the range of about 2 seconds to about 10 seconds, in place of, or in conjunction with, supplying the purge gas, in order to purge the remaining portion 14 of the reactants.

Figure 1C:
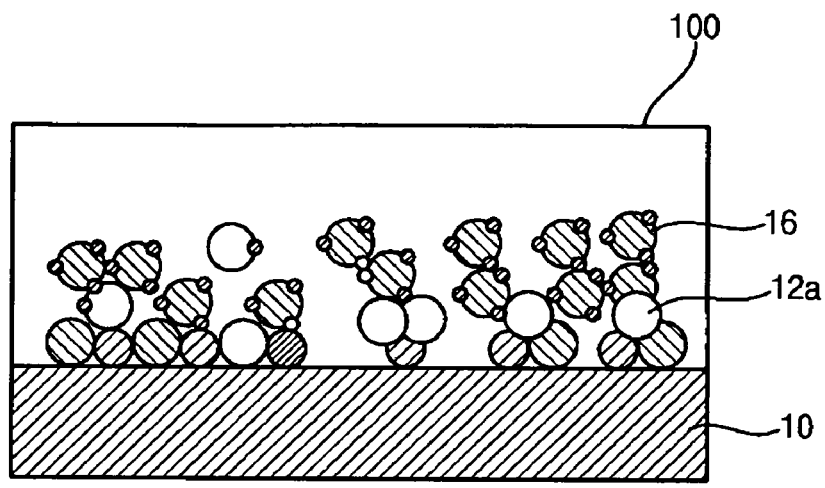

Referring to FIG. 1C, an oxidizing agent 16 is supplied into chamber 100, according to some embodiments of the present invention. Examples of the oxidizing agent 16 include ozone ($O_3$) gas, water vapor ($H_2O$), oxygen ($O_2$) gas, plasma-activated oxygen ($O_2$) gas, and remote plasma-activated oxygen ($O_2$) gas. These oxidizing agents 16 may be used alone or in combinations thereof. According to some embodiments, ozone gas is supplied as the oxidizing agent 16 to the chamber 100 for a time period in the range of about 1 second to about 7 seconds. The oxidizing agent 16 chemically reacts with the precursor molecules 12a, which are chemisorbed onto the substrate 10, thereby oxidizing the precursor molecules 12a.

Figure 1D:
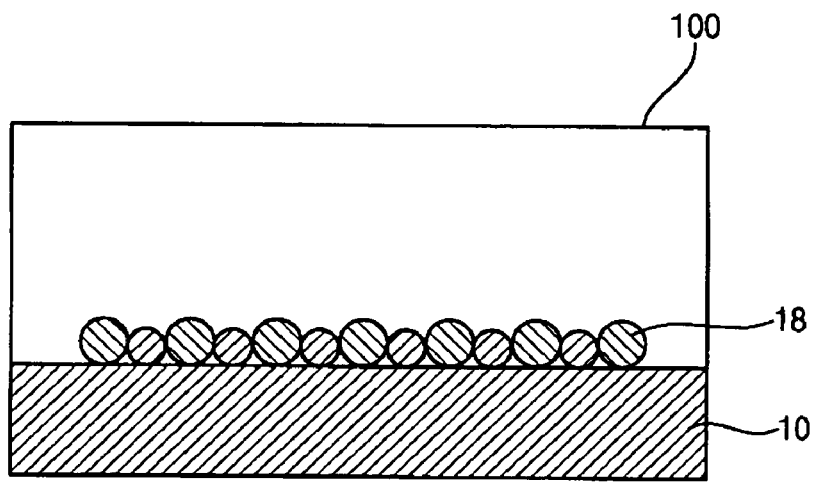

Referring to FIG. 1D, a purge gas is then supplied to the chamber 100, according to some embodiments, for a time period in the range of about 0.5 seconds to about 20 seconds in a manner similar to or the same as described in FIG. 1B, so that any residual oxidizing agent 16 that has not reacted with the precursor molecules 12a may be purged out from the chamber 100.

As a result, a solid material 18 including zirconium hafnium oxide is formed on the substrate 10.

Figure 1E:
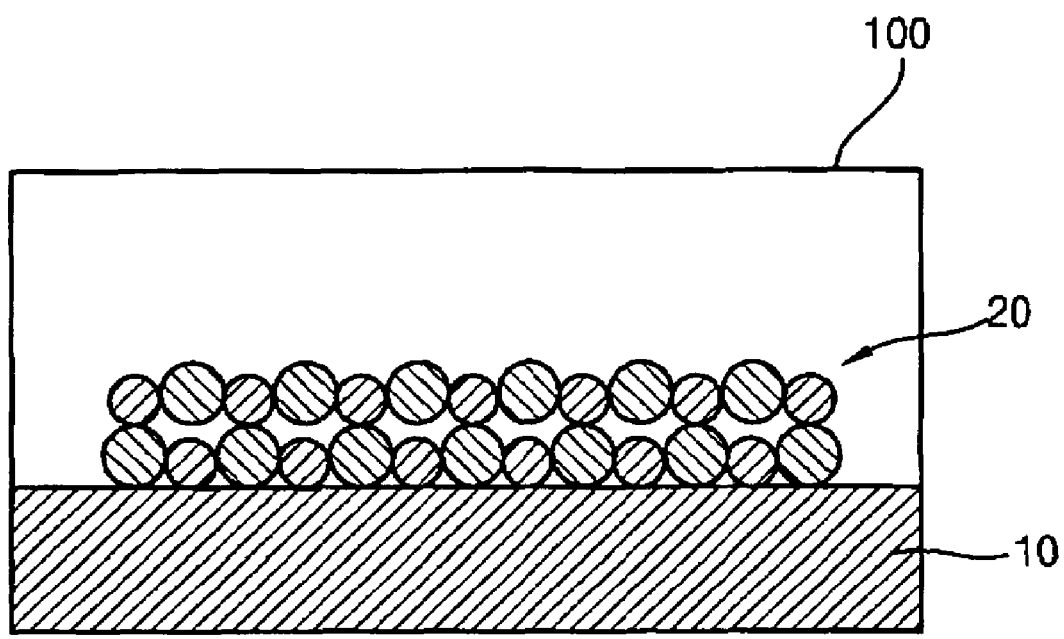

Referring to FIG. 1E, similar methods described above with reference to FIGS. 1A to 1D are repeated at least once, according to some embodiments, and thus, the solid material 18 is sequentially stacked on the substrate 10, thereby forming a zirconium hafnium oxide thin layer 20 on the substrate 10. The thickness of the thin layer 20 is determined by the number of times the methods of FIGS. 1A to 1D are repeated.

According to some embodiments, a thin zirconium hafnium oxide layer is formed on substrate 10 using TEMAZ, as a zirconium precursor, and TEMAH, as a hafnium precursor, so that the thin layer has a high dielectric constant provided by the zirconium oxide and desirable surface morphology provided by the hafnium oxide. The hafnium oxide further provides the thin layer with a high crystallization temperature, so that subsequent processes may be performed on the layer-coated substrate 10 at a wider temperature range than performed previously. Some embodiments are characterized by the fact that a mixture of precursors is used as the reactant material, and that the thin layer is formed, not as a single layer, but as a composite layer or multi-layer having a laminate structure.

Figure 6A:
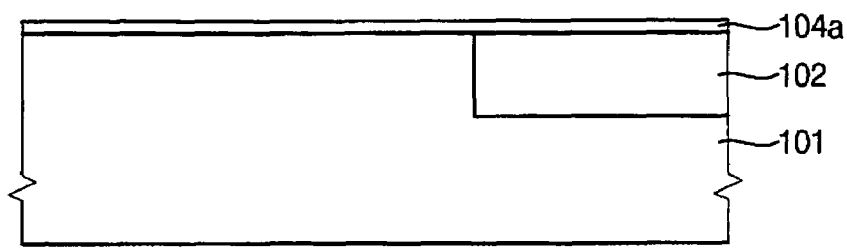
FIGS. 6A to 6H are cross-sectional views illustrating methods of forming a gate structure and a capacitor on the gate structure in a semiconductor device according to some embodiments of the present invention.

Referring to FIG. 6A, a substrate 101, such as a silicon wafer, is separated into an active region, in which a conductive structure is formed, and a field region 102 for isolating the active regions adjacent to each other through an isolation process.

Then, according to some embodiments, a gate insulation layer 104a is formed on the substrate 101, and in some embodiments at a thickness in the range of about 20 Å to about 100 Å. In some embodiments, the gate insulation layer 104a includes zirconium hafnium oxide, so that current leakage between the gate electrode and the channel is reduced despite a relatively small equivalent oxide thickness (EOT). The gate insulation layer 104a including zirconium hafnium oxide may be formed through methods as described with reference to FIGS. 1A-1E above, and thus, methods for forming the gate insulation layer 104a will not be further described.

Figure 6B:
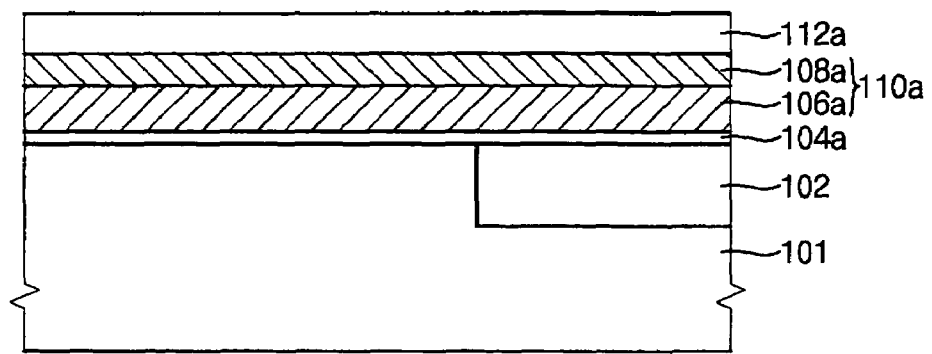

Referring to FIG. 6B, a gate conductive layer 110a is formed on the gate insulation layer 104a. In some embodiments, the gate conductive layer 110a includes a double layer in which a metal silicide layer 108a, for example, a tungsten silicide layer, is stacked on a polysilicon layer 106a. A capping insulation layer 112a including silicon oxide may be further formed on the gate conductive layer 110a.

Figure 6C:
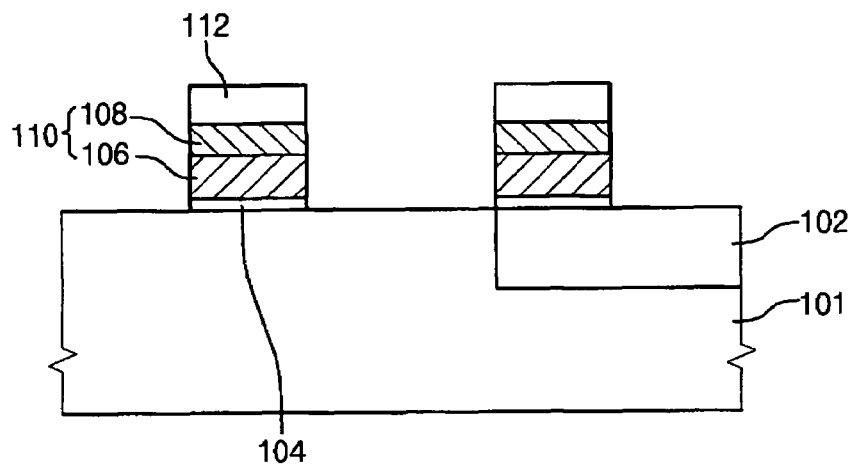

Referring to FIG. 6C, the capping insulation layer 112a, the gate conductive layer 110a, and the gate insulation layer 104a are sequentially patterned, thereby forming a gate structure including the capping insulation pattern 112, the gate conductive pattern 110, and the gate insulation pattern 104 stacked on the substrate 101. In some embodiments, the gate conductive pattern 110 includes the polysilicon pattern 106 and the metal silicide pattern 108.

Figure 6D:
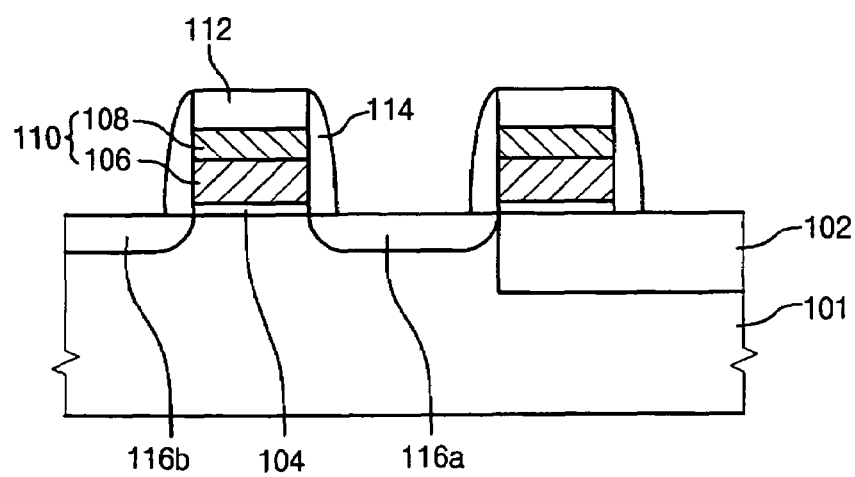

Referring to FIG. 6D, a spacer 114, which in some embodiments includes silicon nitride, is formed on a sidewall of the gate structure. Impurities are lightly doped onto the substrate 101 prior to or after forming the spacer 114, thereby forming source/drain regions 116a and 116b at surface portions of the substrate 101. Each of the source/drain regions 116a and 116b has a lightly doped junction area.

Figure 6E:
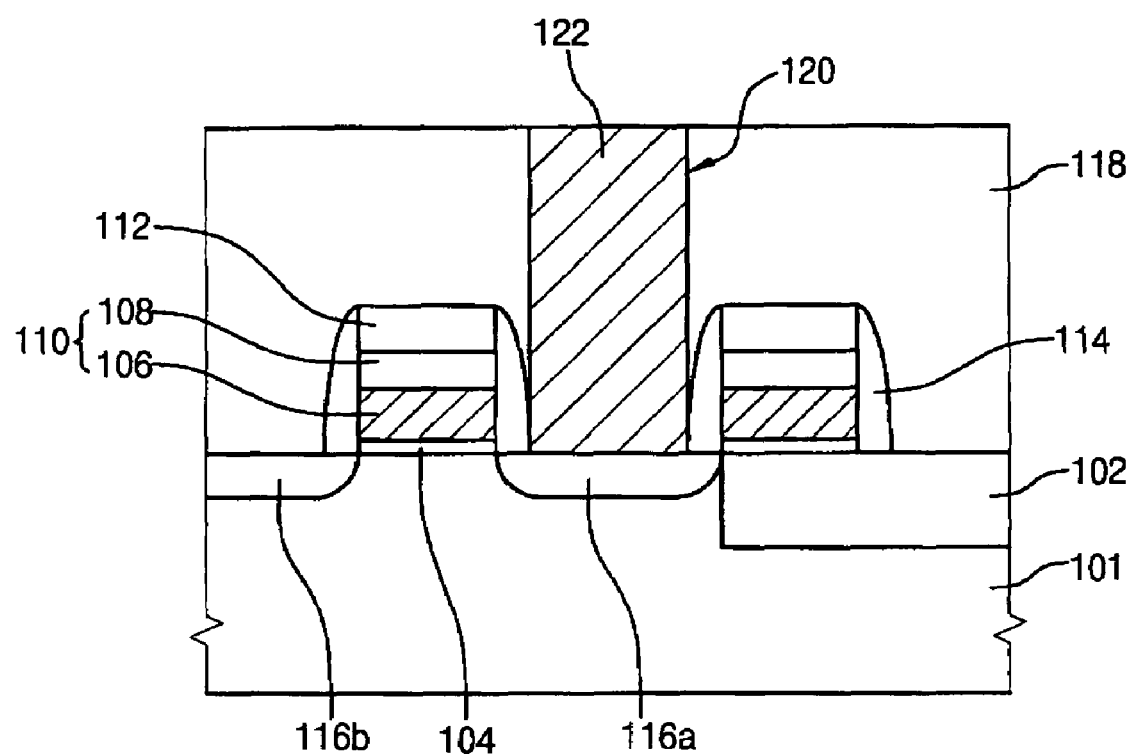

Referring to FIG. 6E, a first insulation layer, which in some embodiments includes an oxide, is formed on the substrate 101, including the gate structure, and is patterned through a photolithography process, thereby forming a first insulation pattern 118, including a first contact hole 120 through which a surface of the source region 116a is exposed. Then, a first conductive layer, which in some embodiments includes polysilicon, is formed on the first insulation pattern 118 to a sufficient thickness to fill the first contact hole 120. The first conductive layer may then be removed and planarized by an etching or a chemical mechanical polishing (CMP) process until the top surface of the first insulation pattern 118 is exposed. As a result, the first conductive layer may remain in the first contact hole 120, thereby forming a contact plug 122 in the first contact hole 120.

Figure 6F:
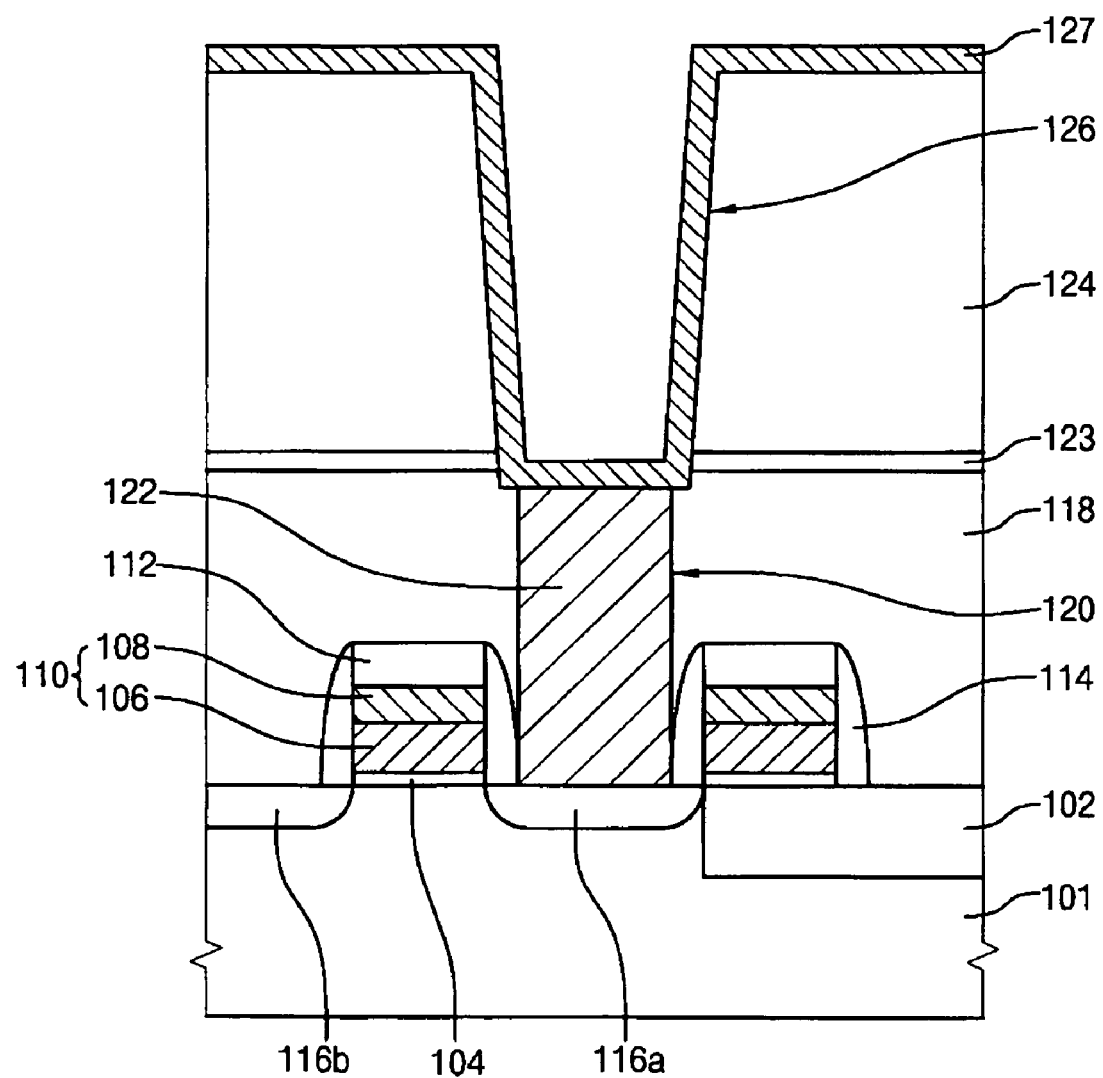
Figure 6G:
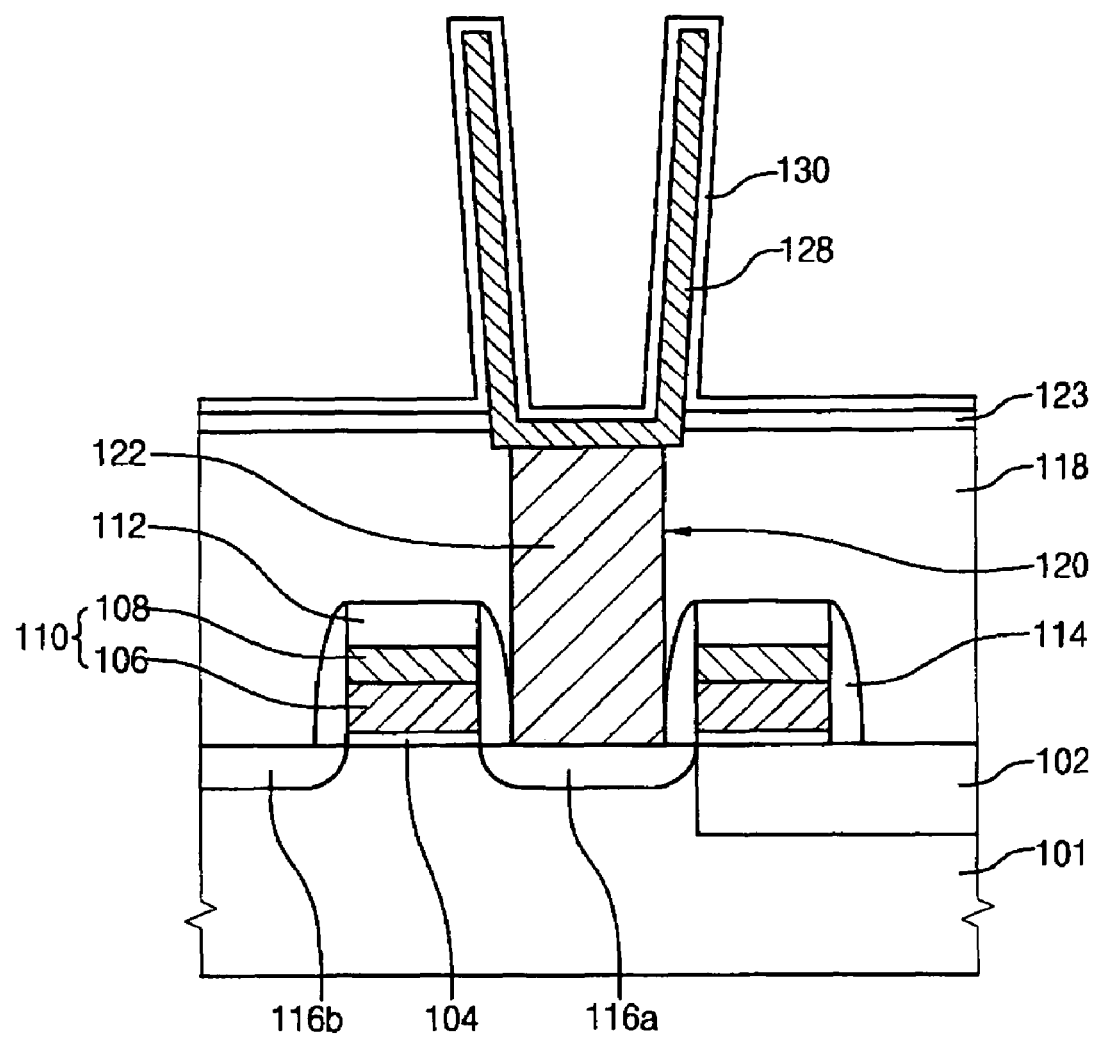

Referring to FIG. 6F, an etch stop layer 123 is formed on the contact plug 122 and the first insulation pattern 118. The etch stop layer 123 includes a material having etching selectivity with respect to the first insulation pattern 118. In some embodiments, the etch stop layer 123 includes silicon nitride or silicon oxynitride. A second insulation layer, which in some embodiments includes an oxide, is formed on the etch stop layer 123 and is patterned through a photolithography process, thereby forming a second insulation pattern 124, including a second contact hole 126 through which a top surface of the contact plug is exposed. In some embodiments, during the formation of the second insulation pattern 124, the first insulation layer is etched by a first etching process up to the top surface of the etch stop layer 123, and then the etch stop layer 123 is etched by a second etching process until the top surface of the contact plug is exposed. In some embodiments, the second contact hole 126 is slanted because, at least in part, the etching rate of the upper portion of the second insulation layer is greater than that of the lower portion of the second insulation layer, so that when the second insulation layer is patterned, the upper portion of the second contact hole 126 is larger than the bottom portion of the second contact hole 126.

A second conductive layer 127 is formed on a top surface of the second insulation pattern 124, and on the side and bottom surfaces of the second contact hole 126, and functions as a lower electrode of a capacitor. The second conductive layer 127 may include polysilicon, titanium nitride, tantalum nitride, tungsten nitride, or ruthenium. The materials may be used alone or in combinations thereof.

Referring to FIG. 6E, a sacrificial layer is formed on the resultant structure including the second conductive layer 127 on the substrate 101, and is removed by an etching or CMP process until the top surface of second conductive layer 127 is exposed. Then, the second conductive layer 127 on the second insulation pattern 124 is removed, so that the second conductive layer 127 only remains on the side and bottom surfaces of the second contact hole 126. The residual sacrificial layer in the second contact hole 126 and the second insulation pattern 124 are removed from the resultant structure, so that only the second conductive layer 127 remains on the contact plug 122. In some embodiments, a plurality of second conductive layers 127 are separated from each other by a node or a cell on the resultant structure, so that a lower electrode 128 of a capacitor is formed on every cell region of the substrate 101. In some embodiments, the lower electrode 128 may be formed to a height in the range of about 10,000 Å to about 17,000 Å as a circular truncated cone shape, so that the upper portion of lower electrode 128 is larger than the lower portion thereof.

A dielectric layer 130 is formed, in some embodiments at a thickness in the range of about 20 Å to about 100 Å, on the surface of the lower electrode 128 and on the top surface of the etch stop layer 123. The dielectric layer 130 includes zirconium hafnium oxide, so that current leakage between an upper electrode and the lower electrode 128 may be reduced despite the relatively small equivalent oxide thickness (EOT) and the relatively high dielectric constant of the dielectric layer 130. The dielectric layer 130 including zirconium hafnium oxide may be formed through the methods described with reference to FIGS. 1A-1E above, and thus, methods for forming dielectric layer 130 will not be described further. The dielectric layer 130, in some embodiments, has a dielectric constant over about 20, so that the capacitance of the capacitor, which includes the dielectric layer 130, may be remarkably improved.

In some embodiments, a heat treatment is further performed on the dielectric layer 130 in order to reduce or remove contaminants and sufficiently cure any oxygen defects in the dielectric layer 130. The heat treatment may include a purifying process using ultra-violet rays, ozone gas, and/or plasma treatment on the dielectric layer 130.

Figure 6H:
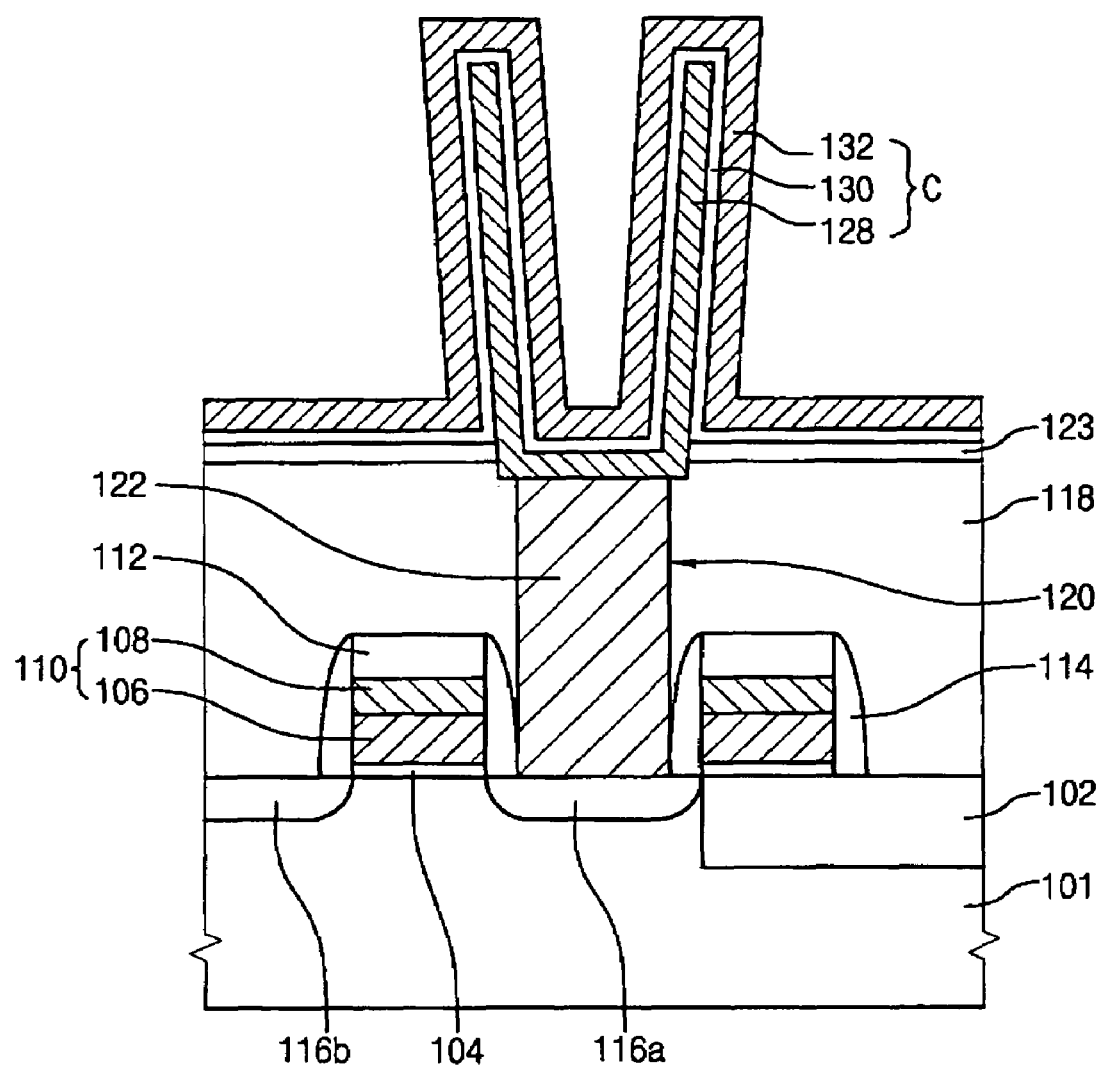

Referring to FIG. 6H, an upper layer 132 is formed along a surface of the dielectric layer 130. The upper layer 132 may include polysilicon, titanium nitride, tantalum nitride, tungsten nitride, or ruthenium. The materials may be used alone or in combinations thereof. As a result, a capacitor C, which includes the lower electrode 128, the dielectric layer 130, and the upper electrode 132, is formed on the substrate 101.

Thus, according to some embodiments of the present invention, the gate insulation layer of a gate structure and the dielectric layer of a capacitor, both of which include zirconium hafnium oxide, are formed on the substrate 101 using a mixture of TEMAZ as a zirconium precursor and TEMAH as a hafnium precursor. The gate insulation layer and the dielectric layer have high dielectric constants due, at least in part, to the zirconium oxide and a desirable surface morphology due, at least in part, to the hafnium oxide. Further, current leakage between a gate electrode and a channel, or between an upper electrode and a lower electrode, may be reduced despite a relatively small equivalent oxide thickness (EOT). As a result, the electrical characteristics of the gate structure including the gate insulation layer, and a capacitor including the dielectric layer, may be remarkably improved.

Figure 7A:
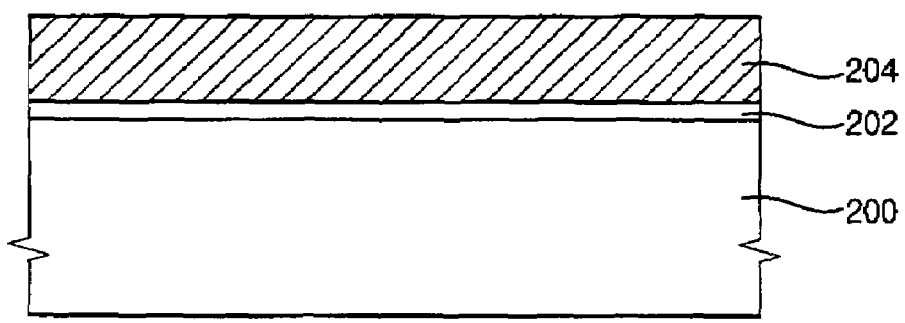
FIGS. 7A to 7D are cross-sectional views illustrating methods of manufacturing a flash memory device according some embodiments of the present invention.

Referring to FIG. 7A, an isolation region, such as a trench isolation layer, is formed on substrate 200, and tunnel oxide layer 202 is formed thereon, and in some embodiments at a thickness in the range of about 10 Å to 500 Å, through a thermal oxidation or radical oxidation process.

According to some embodiments, a first conductive layer 204 is formed on the tunnel oxide layer 202. The first conductive layer 204 may include polysilicon, titanium nitride, tantalum nitride, tungsten nitride, or ruthenium. The materials may be used alone or in combinations thereof.

When the first conductive layer 204 includes polysilicon, a polysilicon layer is formed on the tunnel oxide layer 202 through a first process and impurities are doped into the polysilicon layer through a second process. In some embodiments, silane ($SiH_4$) gas is thermally decomposed in a furnace, and the impurities are doped into the polysilicon layer by ion implantation during the first process and diffusion during the second process. The second process may be performed after or in-situ with the first process. In contrast, when the first conductive layer 204 includes a metal nitride, such as titanium nitride, tantalum nitride, or tungsten nitride, a metal nitride layer may be formed on the tunnel oxide layer by chemical vapor deposition (CVD).

Figure 7B:
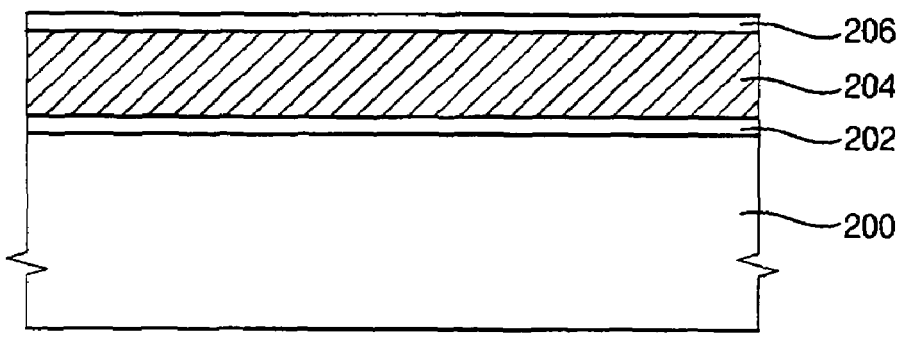

Referring to FIG. 7B, the preliminary dielectric layer 206 is formed on the first conductive layer 204, in some embodiments, at a thickness in the range of about 200-600 Å, and is formed into a dielectric layer for a flash memory device in a subsequent process. In some embodiments, the preliminary dielectric layer 206 includes zirconium hafnium oxide, so that the dielectric layer of the flash memory may have a high capacitance and an improved coupling ratio. The preliminary dielectric layer 206 including zirconium hafnium oxide may be formed through the methods described with reference to FIGS. 1A-1E above, and thus, methods for forming the dielectric layer 206 will not be further described.

Figure 7C:
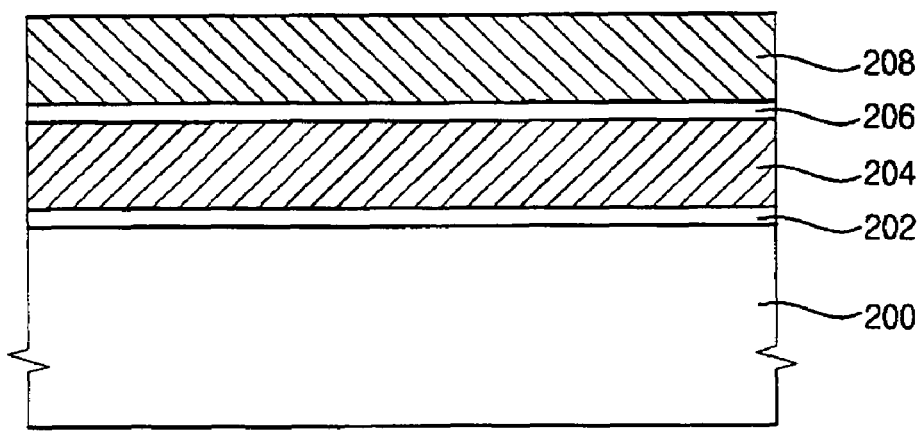

Referring to FIG. 7C, a second conductive layer 208 is formed on the preliminary dielectric layer 206. The second conductive layer 208 may include polysilicon, titanium nitride, tantalum nitride, tungsten nitride, ruthenium, or tungsten. The materials may be used alone or in combinations thereof.

Figure 7D:
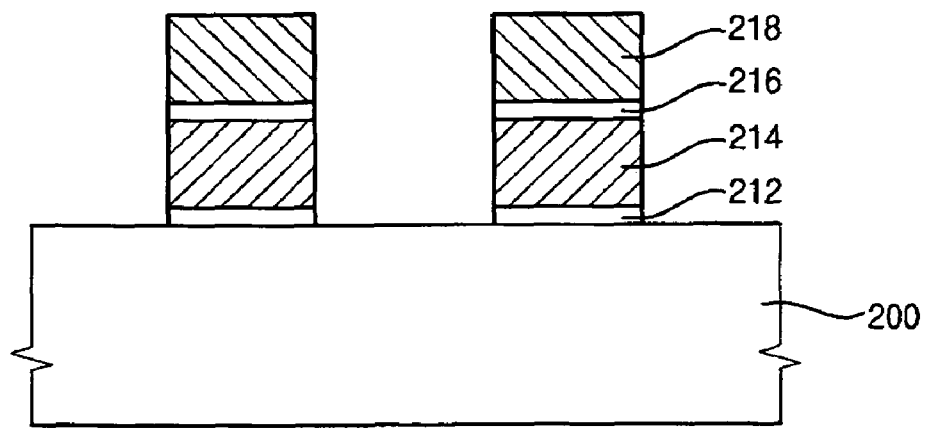

Referring to FIG. 7D, the second conductive layer 208, the preliminary dielectric layer 206, the first conductive layer 204, and the tunnel oxide layer 202 are sequentially patterned, so that the tunnel oxide pattern 212, the floating gate 214, the dielectric layer pattern 216, and the control gate 218 are sequentially stacked on the substrate 200. Thus, according to some embodiments, a gate structure of the flash memory device is formed on the substrate 200 and includes a tunnel oxide pattern 212, a floating gate 214, a dielectric layer pattern 216, and a control gate 218.

According to some embodiments of the invention, a dielectric layer for a flash memory device including zirconium hafnium oxide is formed on the substrate using a mixture of TEMAZ as a zirconium precursor and TEMAH as a hafnium precursor. Thus, the dielectric layer in the flash memory device may have a high dielectric constant due, at least in part, to the zirconium oxide and a desirable surface morphology due, at least in part, to the hafnium oxide. Further, the dielectric layer in the flash memory device may have a high capacitance and an improved coupling ratio due, at least in part, to the high capacitance. As a result, the electrical characteristics of the flash memory may be improved.

Although the previously described embodiments relate to a flash memory device with a planar type of gate structure, the dielectric layer for any other type flash memory device, such as a vertical-type or fin-type, could include zirconium hafnium oxide, as would be known to one of the ordinary skill in the art. In the vertical-type flash memory device, the control gate and a floating gate are vertically arranged in a gate structure, and in the fin-type flash memory device, a channel is protruded out of the substrate in the gate structure.

Although the embodiments of the present invention have been described, it is understood that the present invention should not be limited to these specific embodiments, but that various changes and modifications can be made by one skilled in the art within the spirit and scope of the present invention as hereinafter claimed.

What is claimed is:

1. A method of forming a thin layer, comprising introducing a mixture of gaseous tetrakis(ethylmethylamino)zirconium (TEMAZ) and tetrakis(ethylmethylamino)hafnium (TEMAH) onto a substrate; chemisorbing a first portion of the mixture of TEMAZ and TEMAH onto the substrate; physisorbing a second portion of the mixture of TEMAZ and TEMAH onto the substrate; introducing an oxidizing agent onto the substrate; and chemically reacting the first portion of the mixture of TEMAZ and TEMAH with the oxidizing agent.

2. The method of claim 1, wherein the gaseous mixture of TEMAZ and TEMAH is produced by bubbling a liquid mixture of TEMAZ and TEMAH.

3. The method of claim 2, wherein the liquid mixture of TEMAZ and TEMAH is at a temperature in the range of about 60° C. to about 160° C.

4. The method of claim 1, wherein the oxidizing agent comprises ozone, water vapor, oxygen, plasma-activated oxygen, remote plasma-activated oxygen, or a combination thereof.

5. The method of claim 1, wherein the thin layer comprises a gate oxide layer.

6. The method of claim 1, wherein the thin layer comprises a dielectric layer.

7. The method of claim 1, wherein forming the thin layer is performed at a temperature in the range of about 200° C. to about 500° C.

8. The method of claim 1, wherein forming the thin layer is performed at a pressure in the range of about 0.1 torr to about 3 torr.

9. The method of claim 1, wherein the method is repeated at least once.

10. The method of claim 1, wherein forming the thin layer further comprises: removing the second portion of the mixture of TEMAZ and TEMAH; and removing a portion of the oxidizing agent that has not reacted with the first portion of the mixture of TEMAZ and TEMAH.

11. The method of claim 10, wherein the method is performed by using a purge gas.

12. A method of forming a gate structure for a semiconductor device, comprising forming a gate insulation layer of the gate structure by a method comprising introducing a mixture of gaseous tetrakis(ethylmethylamino)zirconium (TEMAZ) and tetrakis(ethylmethylamino)hafnium (TEMAH) onto a substrate; chemisorbing a first portion of the mixture of TEMAZ and TEMAH onto the substrate; physisorbing a second portion of the mixture of TEMAZ and TEMAH onto the substrate; introducing an oxidizing agent onto the substrate; and chemically reacting the first portion of the mixture of TEMAZ and TEMAH with the oxidizing agent.

13. The method of claim 12, wherein forming the gate structure further comprises: forming a gate conductive layer on the gate insulation layer; and forming a gate insulation pattern and a gate conductive pattern on the substrate by sequentially patterning the gate conductive layer and the gate insulation layer.

14. The method of claim 13, wherein the oxidizing agent comprises ozone, water vapor, oxygen, plasma-activated oxygen, remote plasma-activated oxygen, or a combination thereof.

15. The method of claim 13, wherein forming the gate insulation layer further comprises: removing the second portion of the mixture of TEMAZ and TEMAH; and removing a portion of the oxidizing agent that has not reacted with the first portion of the mixture of TEMAZ and TEMAH.

16. The method of claim 15, wherein forming the gate insulation layer is performed at a temperature in a range of about 200° C. to 500° C. and at a pressure in the range of about 0.1 torr to about 3.0 torr.

17. The method of claim 15, wherein the method is repeated at least once.

18. A method of forming a capacitor for a semiconductor device, comprising forming a dielectric layer on a lower electrode by a method comprising: introducing a mixture of gaseous tetrakis(ethylmethylamino)zirconium (TEMAZ) and tetrakis(ethylmethylamino)hafnium (TEMAH) onto the lower electrode; chemisorbing a first portion of the mixture of TEMAZ and TEMAH onto the lower electrode; physisorbing a second portion of the mixture of TEMAZ and TEMAH onto the lower electrode; introducing an oxidizing agent onto the lower electrode; and chemically reacting the first portion of the mixture of TEMAZ and TEMAH with the oxidizing agent.

19. The method of claim 18, wherein forming the capacitor comprises:
    forming the lower electrode on a substrate;
    forming the dielectric layer on the lower electrode, the dielectric layer comprising zirconium hafnium oxide; and
    forming an upper electrode on the dielectric layer.

20. The method of claim 19, wherein the oxidizing agent comprises ozone, water vapor, oxygen, plasma-activated oxygen, remote plasma-activated oxygen, or a combination thereof.

21. The method of claim 19, wherein forming the dielectric layer further comprises:
    removing the second portion of the mixture of TEMAZ and TEMAH; and
    removing a portion of the oxidizing agent that has not reacted with the first portion of the mixture of TEMAZ and TEMAH.

22. The method of claim 21, wherein forming the dielectric layer is performed at a temperature in the range of about 200° C. to 500° C. and at a pressure in the range of about 0.1 torr to about 3.0 torr.

23. The method of claim 21, wherein the method of forming the dielectric layer is repeated at least once.

24. The method of claim 19, wherein the lower electrode and the upper electrode independently comprise polysilicon, titanium nitride, tantalum nitride, tungsten nitride, or ruthenium.

25. A method of manufacturing a flash memory device, comprising forming a dielectric layer on a floating gate by a method comprising: introducing a mixture of tetrakis(ethylmethylamino)zirconium (TEMAZ) and tetrakis(ethylmethylamino)hafnium (TEMAH) onto the floating gate; chemisorbing a first portion of the mixture of TEMAZ and TEMAH onto the floating gate; physisorbing a second portion of the mixture of TEMAZ and TEMAH onto the floating gate; introducing an oxidizing agent onto the floating gate; and chemically reacting the first portion of the mixture TEMAZ and TEMAH with the oxidizing agent.

26. The method of claim 25, wherein the method of manufacturing the flash memory device further comprises:
    forming a tunnel oxide layer on a substrate;
    forming the floating gate on the tunnel oxide layer;
    forming the dielectric layer on the floating gate, the dielectric layer comprising zirconium hafnium oxide; and
    forming a control gate on the dielectric layer.

27. The method of claim 26, wherein the oxidizing agent comprises ozone, water vapor, oxygen, plasma-activated oxygen, plasma-activated oxygen, or a combination thereof.

28. The method of claim 26, wherein forming the dielectric layer further comprises:
    removing the second portion of the mixture of TEMAZ and TEMAH; and
    removing a portion of the oxidizing agent that has not reacted with the first portion of the mixture of TEMAZ and TEMAH.

29. The method of claim 28, wherein forming the dielectric layer is performed at a temperature in the range of about 200° C. to 500° C. and at a pressure in the range of about 0.1 torr to about 3.0 torr.

30. The method of claim 28, wherein the method of forming the dielectric layer is repeated at least once.

31. The method of claim 26, wherein the floating gate comprises polysilicon, titanium nitride, tantalum nitride, tungsten nitride, or ruthenium; and the control gate comprises polysilicon, titanium nitride, tantalum nitride, tungsten nitride, ruthenium, or tungsten.

* * * * *